United States Patent
Morrish

(10) Patent No.: US 6,614,306 B1
(45) Date of Patent: Sep. 2, 2003

(54) BIAS CIRCUIT FOR CLASS AB HIGH FREQUENCY AMPLIFIERS

(75) Inventor: Andrew J. Morrish, Saratoga, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/000,941

(22) Filed: Oct. 19, 2001

(51) Int. Cl.[7] .............................................. H03F 3/26
(52) U.S. Cl. ..................... 330/266; 330/267; 330/311
(58) Field of Search ........................... 330/98, 99, 100, 330/255, 265, 266, 267, 292, 311

(56) References Cited

U.S. PATENT DOCUMENTS

| | | | |
|---|---|---|---|
| 5,337,012 A | * 8/1994 | Dijkmans | 330/266 |
| 6,163,211 A | 12/2000 | Morrish | 330/98 |
| 6,417,736 B1 | * 7/2002 | Lewyn | 330/267 X |

* cited by examiner

*Primary Examiner*—Steven J. Mottola
(74) *Attorney, Agent, or Firm*—Merchant & Gould; Mark R. Hennings

(57) ABSTRACT

A high-speed cascode amplifier includes a cascode input stage. The cascode input stage sinks a cascode current in proportion to an input signal. The cascode current is sourced through two conduction paths. A first conduction path corresponds to the operating current for a diode multiplier transistor. The second conduction path corresponds to an alternate conduction path other than through the diode multiplier transistor. The size of the diode multiplier transistor is reduced by proper arrangement of the alternate path, such that the frequency response of the amplifier is improved. The $V_{CE}$ of the diode multiplier transistor is maintained at a stable level by adjusting the bias current of the diode multiplier transistor. The diode multiplier provides a temperature-compensated bias current to the class AB amplifier stage for producing the output signal.

21 Claims, 2 Drawing Sheets

BIAS CIRCUIT FOR CLASS AB HIGH FREQUENCY AMPLIFIERS

FIELD OF THE INVENTION

The present invention relates to a method and apparatus for biasing high-speed class AB amplifiers. More specifically, the present invention is directed to improving the frequency response of a class AB amplifier stage by properly arranging a diode multiplier circuit that is in the bias stage of the amplifier.

BACKGROUND OF THE INVENTION

A diode multiplier includes a transistor and a resistor network. The transistor has an inherent base-emitter voltage ($V_{BE}$). The resistor network in the diode multiplier is arranged such that an output voltage that corresponds to a multiplication of the base-emitter voltage is provided. The diode multiplier ideally maintains an output voltage that is constant. In practice, the output voltage increases as the collector current of the transistor in the diode multiplier increases.

A conventional diode multiplier may be arranged in a cascode amplifier. As the input signal to the amplifier increases, the collector current of the transistor in the diode multiplier increases. A large transistor, or a Darlington device, can be used to minimize the increase in the collector current of the transistor in the diode multiplier. The use of such large devices results in a corresponding increase in the parasitic collector capacitance of the device in the diode multiplier. The increase of the capacitance causes an increase in the RC time constant (formed by a load resistance and the collector capacitance, among others). Conventional diode multipliers have poor frequency response characteristics due to the collector capacitance.

The transistor in the diode multiplier is sized to bias the complementary inputs of a class AB amplifier. The bias current provided for the class A stage of the class AB amplifier must be high when the amplifier is operating near the supply rail. However, the bias currents should be limited to minimize excessive bias currents at low voltage outputs of the amplifier. Excessive bias currents for low voltage outputs of the amplifier can result in "shoot through" of the class B stage of the class AB amplifier. "Shoot through" may result in excessive power dissipation and possibly thermal runaway. The bias current provided by the diode multiplier must also be sufficiently low for when the amplifier is operating near the supply rail, but not so low as to provide insufficient bias current at low voltage outputs of the amplifier. An insufficient bias current at low voltage can result in "crossover distortion" of the class A stage of the class AB amplifier.

SUMMARY OF THE INVENTION

The present invention relates to a method and apparatus for biasing high-speed class AB amplifiers. More specifically, the present invention is directed to improving the frequency response and reducing the power consumption of a class AB amplifier stage by arranging a diode multiplier circuit in the bias stage of the amplifier.

A high-speed amplifier according to the present invention includes a cascode input stage for receiving an input voltage, a diode multiplier for providing a temperature-compensated bias current, and a class AB amplifier stage for providing an output signal. The cascode input stage sinks a cascode current in proportion to an input signal. The cascode current is sourced in part through a first load resistor that limits a current through the transistor of the diode multiplier. The cascode current is also sourced in part through a second load resistor that sources a majority of the cascode current. Accordingly, the diode multiplier transistor may be made smaller than the cascode transistor of the cascode input stage because the transistor of the diode multiplier carries less current than a transistor in the cascode input stage. The reduction in size of the diode multiplier transistor enhances the frequency response of the diode multiplier. Any rise in voltage in the diode multiplier transistor $V_{CE}$ is applied to a resistor network that increases the bias current of the diode multiplier transistor, which negates the rise of the diode multiplier transistor $V_{CE}$ and maintains the $V_{CE}$ at a stable level. The diode multiplier provides a temperature-compensated bias current to the class AB amplifier stage for producing the output signal.

DETAILED DESCRIPTION OF THE PREFERRED EMBODIMENT

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal, electromagnetic wave signal, or data signal. The meaning of "a", "an", and "the" include plural references. The meaning of "in" includes "in" and "on." The term "operating current" means the current that flows in a device.

The present invention is directed to a method and apparatus that improves the frequency response and reduces the power consumption in a class AB amplifier. A diode multiplier circuit is employed in a bias stage for the amplifier. The diode multiplier circuit includes a diode multiplier transistor. A parasitic capacitance is present at the node that includes the collector of the diode multiplier transistor. The parasitic capacitance is a lumped capacitance that is primarily due to the parasitic capacitance from the collector of the diode multiplier transistor. Other capacitances from other devices and structures present at the diode multiplier transistor collector node also contribute to the parasitic capacitance. The capacitance present at the diode multiplier transistor collector node is reduced by reducing the size of the collector of the diode multiplier transistor. The frequency response of the amplifier is increased by reducing the parasitic capacitance at the diode multiplier transistor collector node.

A second load resistor is arranged to reduce the operating current (i.e. collector current) of the diode multiplier transistor. The diode multiplier transistor may be reduced in size by reducing the current-carrying requirements of the diode multiplier transistor. The frequency response of the diode multiplier transistor is increased due to the reduced parasitic capacitance that results from using a smaller transistor. The second load resistor is also arranged to send an additional base current to the base of the diode multiplier transistor in response to an increase in the collector-emitter voltage ($V_{CE}$) of the diode multiplier transistor. The base current is proportional to the operating current of the diode multiplier transistor and effectively prevents the $V_{CE}$ of the diode multiplier transistor from increasing when the current flow through the diode multiplier transistor increases. Accordingly, the base current is increased whenever the $V_{CE}$ of the diode multiplier transistor increases and acts to reduce the increase of the $V_{CE}$.

Figure 1:
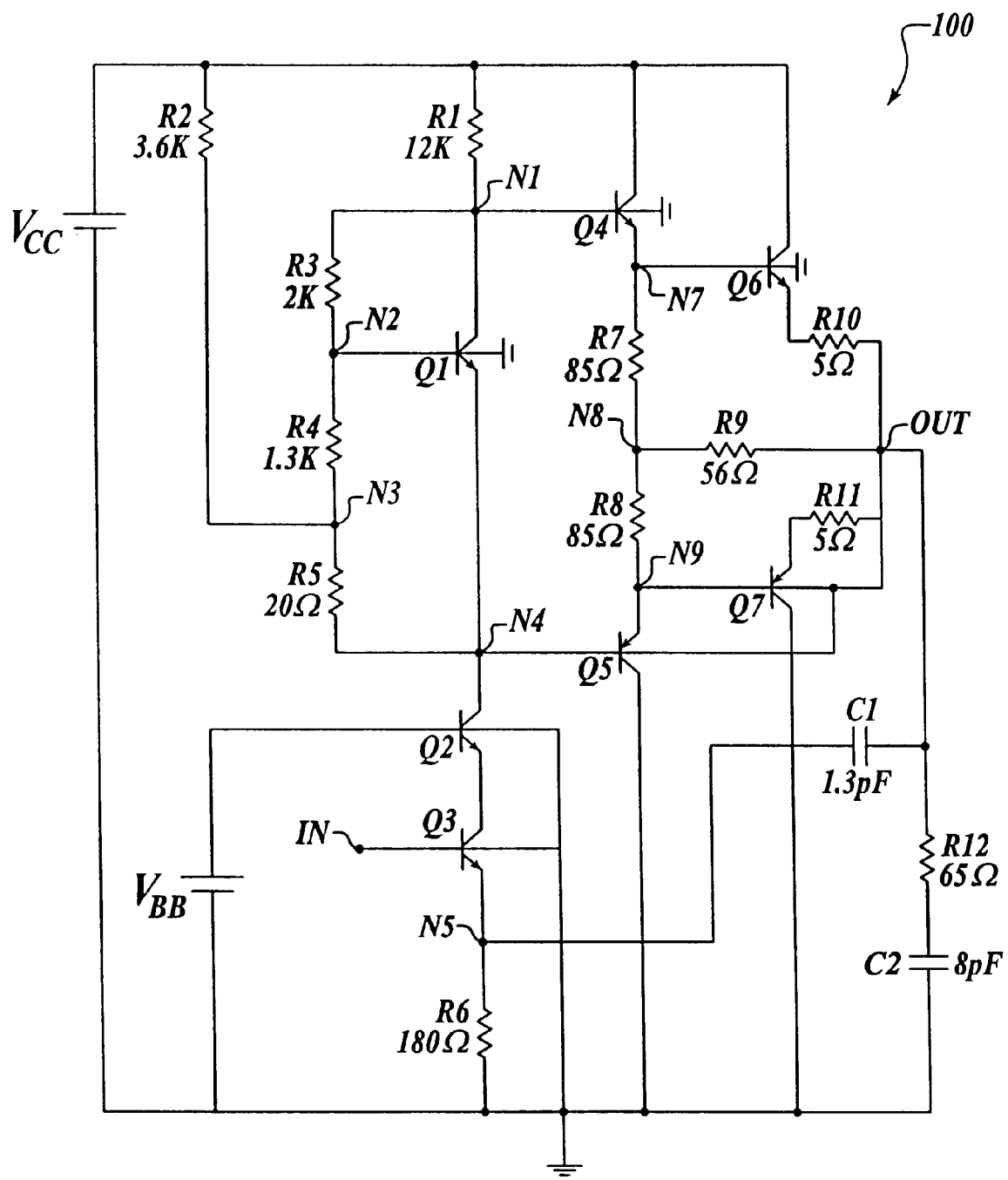
FIG. 1 is a schematic diagram of an example class AB amplifier that employs a diode multiplier in accordance with the present invention.

FIG. 1 is a schematic diagram of an example class AB amplifier (100) that employs a diode multiplier circuit that is in accordance with the present invention. The class AB amplifier (100) includes seven transistors (Q1–Q7), 12 resistors (R1–R12), and two capacitors (C1–C2). $V_{CC}$ and $V_{BB}$ are provided as voltage supplies for the amplifier. In another example embodiment, transistors that are of a type that is complementary to the type of each transistor that is described herein may also be used in accordance with the instant invention. Using complementary types of transistors to those described herein may be accomplished by using voltage supplies that have an opposite polarity to those described.

Transistor Q1 is an NPN transistor that has a collector coupled to node N1, a base coupled to node N2, an emitter coupled to node N4, and a substrate coupled to ground. Transistor Q2 is an NPN transistor that has a collector coupled to node N4, a base coupled to $V_{BB}$, an emitter coupled to the collector of transistor Q3, and a substrate coupled to ground. Transistor Q3 has a collector connected to the emitter of transistor Q2, a base connected to node IN, an emitter coupled to node N5, and a substrate coupled to ground. Transistor Q4 is an NPN transistor that has a collector coupled to $V_{CC}$, a base coupled to node N1, an emitter coupled to node N7, and a substrate coupled to ground. Transistor Q5 is a PNP transistor that has an emitter coupled to node N9, a base that is coupled to node N4, a collector that is coupled to ground, and a substrate that is coupled to node OUT. Transistor Q6 is an NPN transistor that has a collector coupled to $V_{CC}$, a base that is coupled to node N7, an emitter that is coupled to resistor R10, and a substrate that is coupled to ground. Transistor Q7 is a PNP transistor that has an emitter coupled to resistor R11, a base that is coupled to node N9, a collector that is coupled to ground, and a substrate that is coupled to node OUT.

Resistor R1 is coupled between $V_{CC}$ and node N1. Resistor R2 is coupled between $V_{CC}$ and node N3. Resistor R3 is coupled between node N1 and node N2. Resistor R4 is coupled between node N2 and node N3. Resistor R5 is coupled between node N3 and node N4. Resistor R6 is coupled between node N5 and ground. Resistor R7 is coupled between node N7 and node N8. Resistor R8 is coupled between node N8 and node N9. Resistor R9 is coupled between node N8 and node OUT. Resistor R10 is coupled between the emitter of transistor Q6 and node OUT. Resistor R11 is coupled between the emitter of transistor Q7 and node OUT. Resistor R12 is coupled between node OUT and capacitor C2. Capacitor C1 is coupled between node N5 and node OUT. Capacitor C2 is coupled between resistor R12 and ground.

The amplifier of FIG. 1 includes a diode multiplier circuit (comprising transistor Q1, load resistors R1 and R2, and a resistor network that contains resistors R3–R5), a cascode stage (comprising transistors Q2 and Q3 and emitter resistor R6), and a class AB output stage (comprising transistors Q4–Q7, resistors R7–R12, and capacitor C1 and C2). The association of components with a named portion of the circuit does not limit the operation or association of the components to a named portion of the circuit. The association of the components with a named portion of the circuit is given for the sole purpose of convenient reference in this discussion.

The cascode input stage sinks a cascode operating current in proportion to an input signal. The cascode operating current is sourced in part by the diode multiplier transistor collector current. The cascode operating current is limited by a first load resistor (R1). The cascode operating current is also sourced by a bypass current (that does not flow through the diode multiplier transistor collector), which is limited by a second load resistor R2. The second load resistor (R2) is thus arranged to increase the cascode operating current beyond the collector current capabilities of the diode multiplier transistor. The gain of the amplifier is defined by the ratio of the emitter impedance of the lower cascode transistor (including resistor R6) to the collector impedance of the upper cascode (including the first and second load resistors R1 and R2 of the diode multiplier circuit).

Figure 2:
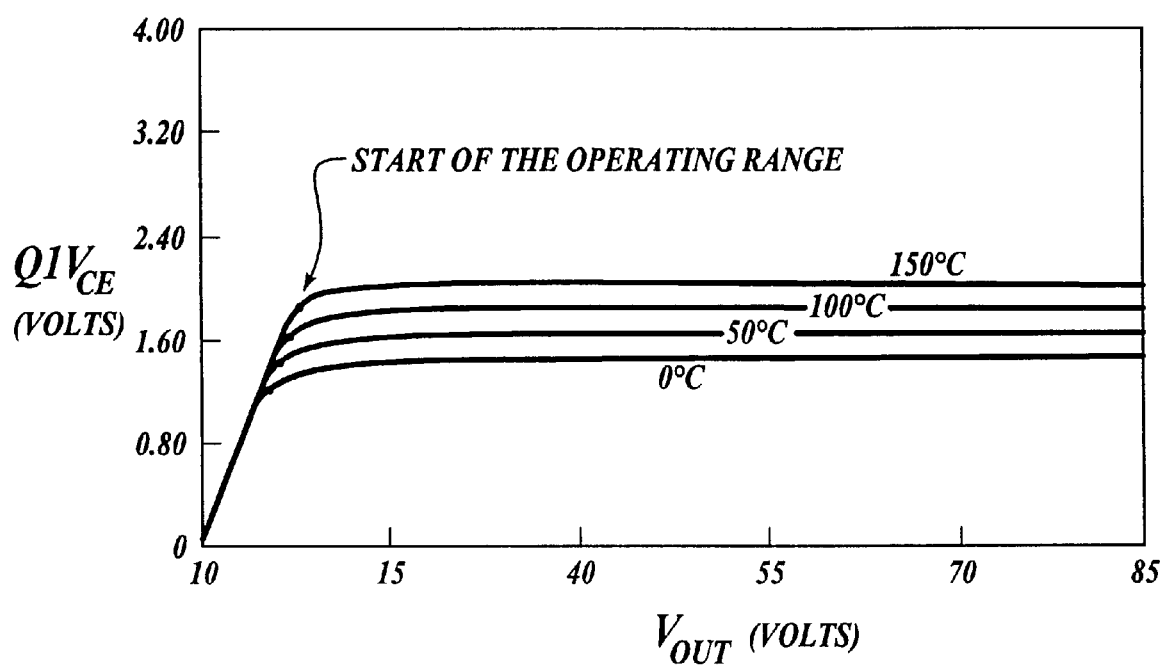
FIG. 2 is a graph of the collector-to-emitter voltage of a diode multiplier transistor that is in accordance with the present invention.

The diode multiplier circuit is arranged to maintain a relatively constant voltage (i.e. the $V_{CE}$ of the diode multiplier transistor Q1) between node 1 and node 4, and to provide a temperature compensated bias current for the output stage. FIG. 2 is a graph of the collector-to-emitter voltage of the diode multiplier transistor Q1 that is in accordance with the present invention. The $V_{CE}$ of the diode multiplier transistor Q1 is maintained within a predetermined range that is within approximately 25 percent of the voltage operating range (at a constant operating temperature). The start of the operating range corresponds to a point of the $V_{CE}$ curve that has a tangent of 45 degrees for a given operating temperature. In an example embodiment, the $V_{CE}$ of diode multiplier transistor Q1 reaches a voltage of 1.2 V when the output voltage is around 16 V at a temperature of zero degrees Celsius.

The class AB output stage is arranged to provide an output signal in response to the cascode operating current. Transistors Q4 and Q5 are arranged to provide class A amplification, while transistors Q6 and Q7 are arranged to provide class B amplification. The amplifier (100) may be implemented in an integrated circuit, although other implementations are possible.

The amplifier of FIG. 1 is a high-speed cascode class AB amplifier that is capable of driving a highly capacitive or resistive load. $V_{CC}$ provides a supply voltage in a range of 65 V–85 V, while $V_{BB}$ provides a bias voltage in a range from 8 V–12 V. An analog input signal is provided in the range of 0.5 V–3 V is applied to the input (node IN) of the amplifier. The amplifier amplifies the input signal and provides an output signal at the output (node OUT). The output signal is capable of driving resistive loads or highly capacitive loads such as the cathode of a CRT.

In operation, an increase in the input signal (applied at node IN) causes the collector current of transistor Q3 to increase. The increase in the collector current of transistor Q3 causes the collector current of cascode transistor Q2 to increase. The increase in the collector current of cascode transistor Q2 causes the collector current of the diode multiplier transistor Q1 to increase. As the collector current of the diode multiplier transistor Q1 increases, the $V_{CE}$ of transistor Q1 also tends to increase. The increase in the $V_{CE}$ of transistor Q1 causes the bypass current flow through resistors R2 and R5 to increase. As the voltage at node N4 decreases, the voltage drop across resistor R5 increases. The voltage drop across resistor R5 causes a rise in the voltage across resistor R4, which results an increase in the base current to transistor Q1. The additional base current compensates for the higher collector current such that a stable $V_{CE}$ voltage is maintained.

Similarly, a decrease in the input signal (applied at node IN) causes the collector current of transistor Q3 to decrease. The decrease of the collector current in transistor Q3 causes the collector current of cascode transistor Q2 to decrease. The decrease in the collector current of cascode transistor Q2 causes the collector current of the diode multiplier transistor Q1 to decrease. As the voltage at node N4 increases, the voltage drop across resistor R5 decreases. The voltage drop across resistor R5 causes a decline in the voltage across resistor R4, which results in a lower base current to transistor Q1. The decrease in the base current compensates for the lower collector current such that a stable $V_{BE}$ voltage is maintained.

The diode multiplier circuit is arranged to provide a bias voltage to bias the class A transistors (Q4 and Q5). The diode multiplier circuit, which is formed by resistor R3, transistor Q1, and resistor R4, roughly provide a bias voltage that is equivalent to the voltage drop of three series connected diodes.

The diode multiplier circuit forms a temperature-compensated bias current when the diode multiplier circuit is located on the same substrate as transistors Q4 and Q5, which are driven by the diode multiplier circuit. Transistors Q1, Q4, and Q5 are at approximately the same temperatures when they are thermally coupled together. Thermal coupling may be accomplished, for example, by providing the transistors on the same substrate, or by collocating discrete transistors in similar thermal environments. Accordingly, the relative electrical performance of the devices (Q1, Q4, and Q5) track one another across the temperature operating range for those transistors. Temperature compensation allows for wider range of operation while avoiding undesirable crossover distortion or "shoot through."

Transistors Q4 and Q5 are arranged as pre-driver emitter followers that perform class A amplification in the class AB stage of the amplifier (100). Accordingly, transistors Q4 and Q5 maintain a quiescent bias current for all phases of the applied input signal and thus avoid undesirable crossover distortion. The quiescent current is determined by an adjusted bias voltage (the $V_{CE}$ of transistor Q1 minus the $V_{BE}$s of transistors Q4 and Q5) divided by the sum of the resistances for emitter resistors R7 and R8. Thus, the output current of the amplifier is drawn through resistors R7 and R9 (or resistors R8 and R9).

Transistors Q6 and Q7 are each arranged in a Darlington configuration, where transistors Q4 and Q6 provide a NPN-type Darlington pair and transistors Q5 and Q7 provide a PNP-type Darlington pair. Transistors Q6 and Q7 perform class B amplification in the class AB stage of the amplifier (100). Accordingly, transistors Q6 and Q7 are active for less than half of the phases of the applied input signal and thus avoid undesirable "shoot through." Additional output current of the amplifier (100) is drawn through resistor R10 (or resistor Ri 1) when the output stage of the amplifier is in the class AB operation. Resistor R9 is arranged to set the voltage of the output signal when transistors Q6 and Q7 are turned off. Resistor RIO and resistor R11 limit the output current of transistors Q6 and Q7 respectively and provide for a balanced output.

Capacitor C1 is a compensation capacitor, which provides feedback to the input stage for increasing the stability of the amplifier at high frequencies. Resistor R12 and capacitor C12 depict a representative load of the amplifier.

Although the above-described circuit is arranged to bias a class AB amplifier, the diode multiplier circuit may be used in other electronic circuits. In one example, the diode multiplier circuit is used with a class A amplifier. In another example, the diode multiplier circuit is used with a push-pull output driver. In yet another example, the diode multiplier circuit is used with a class B amplifier. The diode multiplier circuit may be employed to bias any circuit that requires a relatively constant bias voltage. When employed in an integrated circuit, the diode multiplier circuit also provides compensation for temperature-based variations in the bias voltage requirements for various transistors. Although the diode multiplier circuit is described with a single transistor, other implementations may include more than a single transistor that are arranged provide a similar function. The above specification, examples and data provide a complete description of the manufacture and use of the composition of the invention. Since many embodiments of the invention can be made without departing from the spirit and scope of the invention, the invention resides in the claims hereinafter appended.

I claim:

1. A method, comprising the steps of:

increasing a collector current in a cascode transistor in response to an increase in an input signal of an amplifier;

increasing a collector current in a diode multiplier transistor in response to increasing the collector current in the cascode transistor; and increasing a base current of the diode multiplier transistor in response to increasing the collector current of the diode multiplier transistor such that a collector-to-emitter voltage of the diode multiplier transistor is maintained within a predetermined range.

2. The method of claim 1, further comprising the step of increasing a bypass load current in response to the increased collector current of the diode multiplier transistor, wherein the bypass load current flows through an alternate current path other than through the diode multiplier transistor.

3. The method of claim 2 wherein the bypass load current is greater than the collector current of the diode multiplier transistor.

4. The method of claim 1, further comprising the steps of sizing the diode multiplier transistor in proportion to the collector current of the diode multiplier transistor, and sizing the cascode transistor in proportion to the collector current of the cascode transistor.

5. The method of claim 1, further comprising the step of providing a diode multiplier transistor that is smaller than the cascode transistor.

6. The method of claim 1, further comprising the step of driving an output stage of the amplifier in response to the input signal of the amplifier, wherein the output stage has a first complementary input and a second complementary input.

7. The method of claim 6 wherein the step of driving the output stage further comprises driving the first complementary input with the collector of the diode multiplier transistor and driving the second complementary input with the emitter of the diode multiplier transistor.

8. An apparatus, comprising:
a means for multiplying that is arranged to provide a bias voltage in response to a base-emitter voltage;
a means for increasing an operating current that is arranged to increase an operating current of the means for multiplying in response to an increased input signal in an amplifier circuit; and
a means for maintaining that is arranged to maintain the bias voltage within a predetermined range when the operating current in the means for multiplying increases.

9. The apparatus of claim 8, further comprising a means for bypassing that is arranged to increase a bypass load current when the operating current of the means for multiplying increases.

10. The apparatus of claim 9, wherein the means for multiplying includes a transistor that has a collector current that is less than the bypass load current.

11. The apparatus of claim 9, further comprising means for applying that is arranged to apply the bypass load current to a collector in a cascode transistor.

12. The apparatus of claim 8, wherein the means for multiplying includes a transistor that is sized in proportion to the collector current in the means for multiplying, and a cascode transistor in the means for increasing is sized in proportion to a collector current of the cascode transistor.

13. The apparatus of claim 8, further comprising means for driving that is arranged to drive an output stage of the amplifier in response to the increased input signal, wherein the output stage has a first complementary input and a second complementary input.

14. The apparatus of claim 13, wherein the means for driving the output stage further comprises a means for driving the first complementary input using the collector of the diode multiplier transistor and a means for driving the second complementary input using the emitter of the diode multiplier transistor.

15. An apparatus, comprising:
a cascode amplifier stage that is configured to produce a cascode signal in response to an input signal;
an amplifier output stage that is configured to provide an output signal in response to the cascode signal; and
a diode multiplier that is responsive to the cascode signal and arranged to provide a bias signal to the amplifier output stage, wherein the diode multiplier includes a transistor that has a collector current and a base current that increase when the input signal increases such that a relatively constant base-to-emitter voltage is maintained within a predetermined range.

16. The apparatus of claim 15, further comprising a first load resistor that is configured to limit the collector current of the transistor in the diode multiplier.

17. The apparatus of claim 15, further comprising a second load resistor that is coupled to the emitter of the transistor in the diode multiplier and that is configured to limit a bypass current that bypasses the collector of the transistor in the diode multiplier.

18. The apparatus of claim 15, wherein a first load resistor has a resistance that is greater than the resistance of a second load transistor.

19. The apparatus of claim 15, the cascode amplifier stage further comprising a cascode transistor that has a collector that is coupled to the emitter of the transistor in the diode multiplier.

20. The apparatus of claim 19, the cascode amplifier stage further comprising an input transistor that has a base that is configured to receive the input signal and a collector that is coupled to the emitter of the cascode transistor.

21. The apparatus of claim 19, wherein the amplifier output stage is configured to operate as a class AB amplifier.

* * * * *